United States Patent

Hinshaw et al.

[11] Patent Number: 5,844,312
[45] Date of Patent: Dec. 1, 1998

[54] SOLDERABLE TRANSISTOR CLIP AND HEAT SINK

[75] Inventors: Howard G. Hinshaw; William D. Jordan, both of Dallas; Matthew Smithers, Lewisville, all of Tex.

[73] Assignee: Thermalloy, Inc., Dallas, Tex.

[21] Appl. No.: 786,408

[22] Filed: Jan. 20, 1997

Related U.S. Application Data

[63] Continuation of Ser. No. 543,132, Oct. 13, 1995, abandoned.

[51] Int. Cl.$^6$ .................................................. H01L 23/34
[52] U.S. Cl. ........................... 257/718; 257/722; 361/710; 361/719
[58] Field of Search .................................... 257/718, 719, 257/722; 361/772, 773, 709, 710, 719

[56] References Cited

U.S. PATENT DOCUMENTS

| | | | |
|---|---|---|---|
| 3,641,474 | 2/1972 | Owens | 257/718 |
| 3,694,703 | 9/1972 | Wilens et al. | 257/718 |
| 4,054,901 | 10/1977 | Edwards et al. | 257/718 |
| 4,215,361 | 7/1980 | McCarthy | 257/718 |
| 4,388,967 | 6/1983 | Breese | 165/80 B |
| 4,509,839 | 4/1985 | Lavochkin | 257/718 |
| 4,544,942 | 10/1985 | McCarthy | 257/718 |
| 4,605,058 | 8/1986 | Wilens | 257/718 |
| 4,609,040 | 9/1986 | Moore | 257/718 |
| 4,710,852 | 12/1987 | Keen | 257/718 |
| 4,803,545 | 2/1989 | Birkle | 257/718 |
| 4,884,331 | 12/1989 | Hinshaw | 29/558 |
| 4,933,746 | 6/1990 | King | 257/718 |
| 5,019,942 | 5/1991 | Clemens | 257/718 |
| 5,031,028 | 7/1991 | Galich et al. | 257/718 |
| 5,040,096 | 8/1991 | Churchill et al. | 257/718 |
| 5,138,524 | 8/1992 | Smithers | 257/718 |
| 5,309,979 | 5/1994 | Brauer | 257/718 |
| 5,343,362 | 8/1994 | Solberg | 257/719 |
| 5,373,099 | 12/1994 | Boitard et al. | 257/718 |
| 5,381,041 | 1/1995 | Harmon | 257/718 |
| 5,381,305 | 1/1995 | Harmen et al. | 257/718 |
| 5,466,970 | 11/1995 | Smithers | 257/718 |
| 5,587,608 | 12/1996 | Meng | 257/796 |
| 5,611,393 | 3/1997 | Vasconcelos et al. | 257/718 |

*Primary Examiner*—David Ostrowski
*Attorney, Agent, or Firm*—Woodcock Washburn Kurtz Mackiewicz & Norris LLP

[57] ABSTRACT

A clip secures a heat sink having a slot with grooves on opposing sides thereof to a transistor. The frame has sides with a width therebetween which can be wedged into grooves on opposing sides of a slot in the heat sink. A portion of the frame is raised up between two parallel cuts in the frame. A transistor is wedged under the raised up portion. The clip has legs which are insertable into a printed circuit board for easy assembly of a heat sink, transistor, clip and printed circuit board.

20 Claims, 3 Drawing Sheets

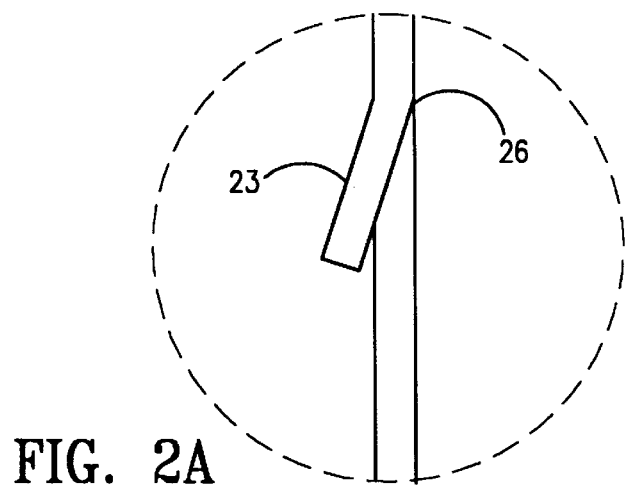
FIG. 2A
FIG. 2
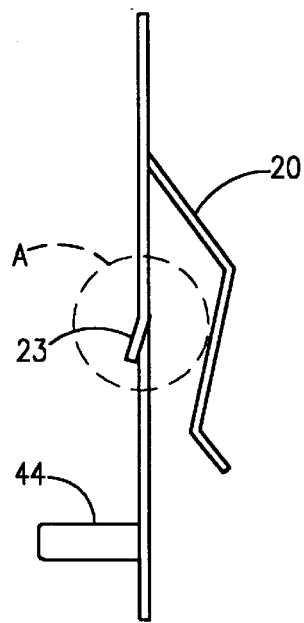
FIG. 3
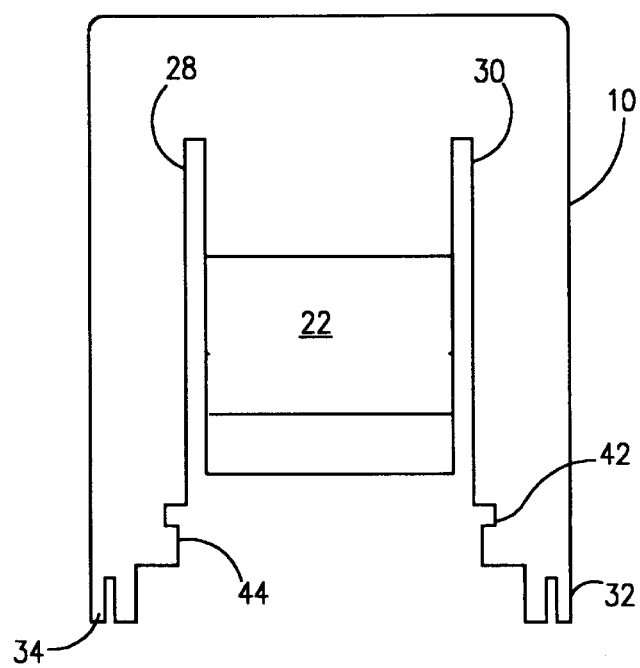

SOLDERABLE TRANSISTOR CLIP AND HEAT SINK

This is a continuation of application Ser. No. 08/543,132, filed Oct. 13, 1995 now abandoned.

BACKGROUND OF THE INVENTION

This invention relates to a clip for attaching an electronic device to a heat dissipating heat sink.

Many semiconductor devices generate heat during operation which must be dissipated to avoid damage to the device. Some such devices have power-handling limitations which are largely determined by their ability to expel internally-generated heat and thereby avoid general or localized thermal degradations or failures within them.

In some semiconductor devices, the internallygenerated heat is dissipated sufficiently by the enclosure, header or leads of the device. In many semiconductor devices, however, it is necessary to aid the dissipation of internally-generated heat by the use of heat sinks. A wide variety of heat sink designs have been employed for dissipation of internally-generated heat from electronic device packages which house semiconductor devices. For the purposes of the present invention, a heat sink is a body of metal or like material which is placed in contact with an electronic device package for transferring internallygenerated heat from the semiconductor device contained in the electronic device package and for rapid dissipation of the internally-generated heat to the atmosphere by conduction, convection and/or radiation.

U.S. Pat. No. 4,884,331-Hinshaw shows a widely used heat sink commonly referred to as a pin fin heat sink. The heat sink has rows and columns of upstanding parallel fins. The heat sinks are formed by first extruding rows of upstanding fins and then cross-cutting the fins to form rows and columns of pin fins.

A method of making heat sinks by transversely punching out spaced apart portions from extruded ribs is described in A PROCESS AND AN APPARATUS FOR FORMING A PROFILED ELEMENT, Fischer et al., Ser. No. 08/249,393, filed May 26, 1994 (attorney docket THRM-0007). This application and the Hinshaw patent are incorporated herein by reference.

U.S. Pat. No. 4,388,967, Breese, shows a mounting stake for securing a heat sink to a printed circuit board. An electronic device to be cooled is secured to the heat sink by a screw or the like. Pages B34 and B35 of the Thermalloy Catalog THERMAL MANAGEMENT SOLUTIONS, HS 9503, show heat sinks to which a transistor has been secured by screw. Page A28 of that catalog shows solderable roll pins which can be used to secure a heat sink to the printed circuit board. Pages 29–31 also show clips which can be used to secure a transistor to the heat sink.

The assembly of prior art clips, heat sinks and semiconductor devices is time consuming and costly.

It is an object of the present invention to provide a clip which makes the assembly of a heat sink to an electronic device much easier.

SUMMARY OF THE INVENTION

In accordance with the present invention, a clip includes a frame having a width which can be wedged into grooves along a slot in the heat sink. The clip has a raised up portion which secures an electronic device to the frame. The frame is wedged in the grooves along the slot in the heat sink. Barbs extend from the sides of the frame to engage the grooves to lock it in place. The rectangular shape of the frame fits into the grooves along the sides of the slots on said heat sink.

The raised up portion of the clip is formed by parallel cuts which are spaced apart by the width of the electronic device. The sides of the frame outside of the raised up portion are guide rails which guide the insertion of a device such as a transistor under the raised up portion.

Feet extend from the frame. These feet can be inserted into the holes of the printed circuit board and then soldered in place. Each of the feet is bifurcated in the portion which fits into the printed circuit board. The surface of the frame above this portion is bent over to form a stand-off portion which engages the surface of the printed circuit board to keep the heat sink from contacting the printed circuit board.

The frame is formed from a sheet of resilient metal so that the resilience of the raised up portion holds the transistor securely against the heat sink.

The clip of the present invention makes it very easy to secure a transistor to a heat sink and secure the assembly to a printed circuit board.

The foregoing and other objects, features and advantages of the invention will be better understood from the following more detailed description and appended claims.

SHORT DESCRIPTION OF THE DRAWINGS

FIG. 2 is a side view of the clip;

FIG. 2A is a side view of the clip detail A of FIG. 2;

FIG. 3 is a front view of the clip;

DESCRIPTION OF THE PREFERRED EMBODIMENT

Figure 1:
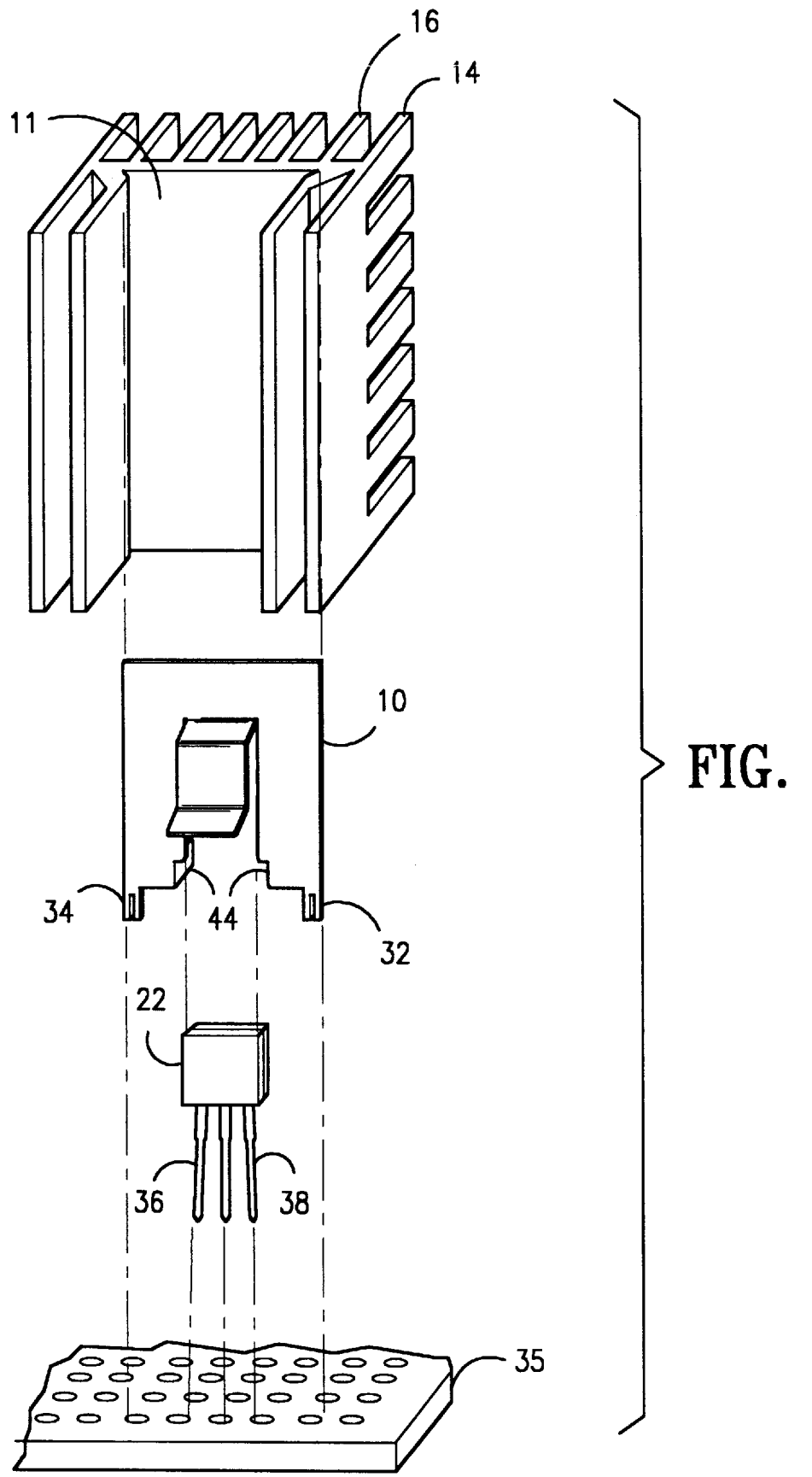
FIG. 1 is an exploded view of a transistor, a heat sink, a printed circuit board and the clip of the present invention.
Figure 4A:
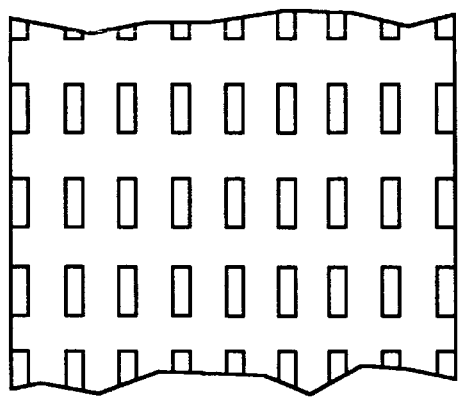
FIG. 4A is a partial view on the line A—A of FIG. 4.
Figure 4:
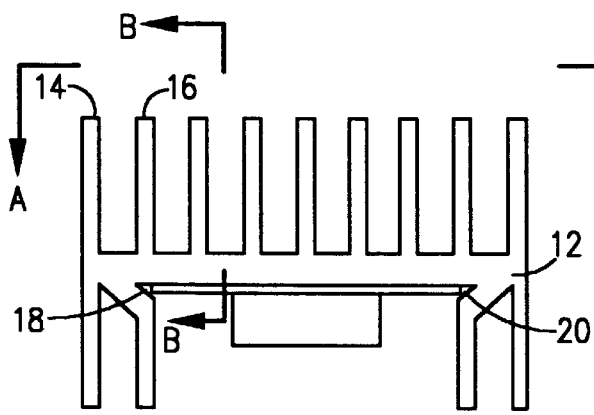
FIG. 4 is a top view of the clip and heat sink.
Figure 5:
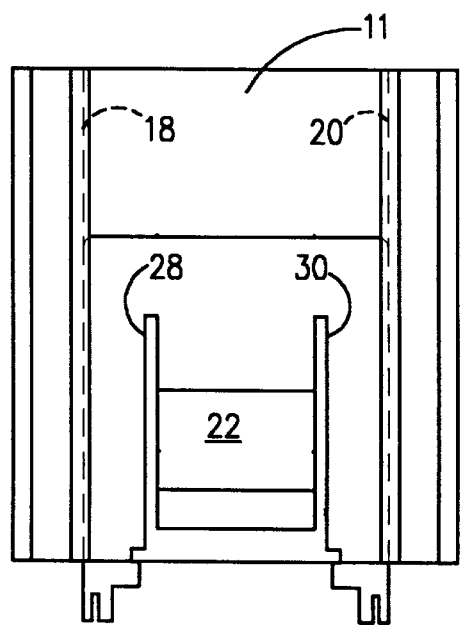
FIG. 5 is a front view of the clip and heat sink.
Figure 4B:
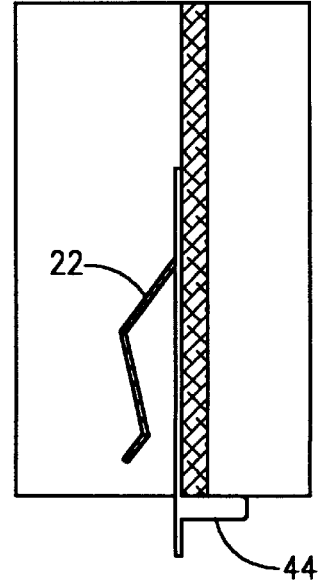
FIG. 4B is a partial view on the line B—B of FIG. 4.

The clip of the present invention includes a frame 10 having a width which fits in the slot 11 of the heat sink 12. Heat sink 12 is of the type made in accordance with the aforementioned Fischer application or the '331 Hinshaw patent. It has pin fins 14, 16, . . . in one row and similar fins in parallel rows.

The clip has a width which can be wedged on opposing sides of slot 11. A raised up portion 20 secures an electronic device such as a transistor 22 to the frame 10. The clip has a barb 23 extending outwardly from the sides of the frame. (Hereinafter the words "outwardly", "upwardly" and "downwardly" will be used to describe elements as viewed in the drawings, but it will be understood that these are relative terms which depend upon the direction from which those elements are viewed). The barb bears against the heat sink to lock the frame to the heat sink.

The barbs extend downwardly and outwardly from a bend line 26 along which the barbs are bent out of the plane of the frame. These barbs lockingly engage the heat sink against movement out of the slots.

The raised up portion 20 of the frame is defined by two parallel cuts 28 and 30 in the frame. The portion 20 is raised up out of the plane of the frame. A transistor 22 is slipped under the raised up portion and is secured against the heat sink by the resilience of the metal of the raised up portion. The clip has downwardly extending feet 32 and 34 which can be inserted into the holes of a printed circuit board 35. These feet are soldered to printed circuit board 35 at the same time that the transistor leads 36 and 38 are soldered to the printed circuit board. The feet 32 and 34 are bifurcated so they can be compressed when they are inserted into the printed circuit board. The resilience holds the feet in the holes of the printed circuit board until they are soldered. An indentation 42 in the feet is provided for manufacturing ease. A stand-off portion 44 of the frame is bent over from the plane of the surface of the frame. This stand-off portion engages the surface of the printed circuit board to keep the heat sink from contacting the printed circuit board and allows for washing flux and debris from the printed circuit board under the heat sink.

The clip is made of resilient metal such as stainless or plated steel. The clip is formed from a sheet of this resilient metal such that the width of the sheet forms the frame 10 which fits in the slot of the heat sink.

Various modifications may be made to the preferred embodiment. The appended claims are, therefore, intended to cover all such modifications within the true spirit and scope of the invention.

What is claimed is:

1. A clip for securing a heat sink to an electronic device, said heat sink having upstanding parallel fins and two members extending parallel to but in opposite directions from said fins, a bottom extending between said two members, a slot defined by said two members and grooves on opposing sides of said two members at said bottom of said slot, said clip comprising:

a frame having sides with a width therebetween which can be wedged into said grooves of said heat sink; a barb extending outwardly from said frame, said barb bearing against said heat sink to secure said frame to said heat sink; and means for securing said electronic device to said frame so that said device is held directly against said heat sink.

2. The clip recited in claim 1 wherein said frame is resilient metal.

3. The clip recited in claim 2 wherein said frame is formed from a sheet of said resilient metal.

4. The clip recited in claim 1 wherein said frame has downwardly extending feet which can be inserted into a printed circuit board.

5. The combination of a heat sink and a clip for securing an electronic device to said heat sink, said heat sink comprising:

upstanding parallel fins extending from said heat sink; and a slot on said heat sink defined by two members extending parallel to but in opposite directions from said fins and a bottom extending between said two members, said slot having grooves on opposing sides of said members at the bottom of said slot, said clip comprising:

a frame having sides with a width therebetween wedged into said grooves of said heat sink; and means for securing said electronic device to said frame so that said device is held directly against said heat sink.

6. The clip recited in claim 5 wherein said clip has a barb extending outwardly from said frame, said barb bearing against said heat sink to secure said frame to said heat sink.

7. The clip recited in claim 6 wherein said frame includes two barbs extending outwardly from opposite sides of said frame.

8. The clip recited in claim 6, wherein said barb extends outwardly from a bend line along which said barb is bent out of the plane of said frame to lockingly engage said heat sink against movement in the direction of said slots.

9. The clip recited in claim 5 wherein said heat sink has upstanding parallel fins on a side opposite said slot.

10. The clip recited in claim 9 wherein said fins are in rows and columns and wherein said frame is rectangular with opposing sides of said frame fitting in said grooves at the bottom of said slot on said heat sink.

11. The clip recited in claim 5 wherein said means for securing said electronic device to said frame incudes a raised up portion defined by two parallel cuts in said frame, said portion being raised up out of the plane of said frame so that said electronic device can be secured against said heat sink by said raised up portion.

12. The clip recited in claim 11 wherein said parallel cuts are spaced apart by the width of said electronic device so that the sides of said frame outside of said raised up portion are guide rails for insertion of said device under said raised up portion.

13. The clip recited in claim 5 wherein said electronic device is a transistor.

14. The clip recited in claim 5 wherein said feet are solderable to said printed circuit board.

15. The clip recited in claim 14 wherein said frame has a flat surface and wherein each of said feet is bifurcated and has an indentation fitting into said printed circuit board.

16. The clip recited in claim 14 wherein the surface above said indentation is bent over to form a standoff portion engaging the surface of said printed circuit board to keep the heat sink from contacting said printed circuit board.

17. The clip recited in claim 16 wherein said standoff portion holds said heat sink above said surface of said printed circuit board so that flux and debris can be removed from said printed circuit board.

18. The combination recited in claim 5 wherein said heat sink has upstanding parallel fins on a side opposite said slot.

19. A clip for securing a heat sink to an electronic device, said heat sink having upstanding parallel fins and two members extending parallel to but in opposite directions from said fins, a bottom extending between said two members, a slot defined by said two members and grooves on opposing sides of said two members at said bottom of said slot, said clip comprising:

a frame having sides with a width therebetween which can be wedged into said grooves of said heat sink; and means for securing said electronic device to said frame including a single raised up portion defined by two parallel cuts in said frame, said parallel cuts being spaced apart by the width of said electronic device so that the sides of said frame outside of said raised-up portion are guide rails for insertion of said device under said raised-up portion so that said electronic device can be secured directly against said heat sink by said raised up portion.

20. A clip for securing a heat sink to an electronic device, said heat sink having upstanding parallel fins and two members extending parallel to but in opposite directions from said fins, a bottom extending between said two members, a slot defined by said two members and grooves on opposing sides of said two members at said bottom of said slot, said clip comprising:

a frame having sides with a width therebetween which can be wedged into said grooves of said heat sink; and means for securing said electronic device to said frame so that said device is held directly against said heat sink, feet extending downwardly from said frame, said feet being insertable into a printed circuit board, said feet being in the surface of said frame, the surface of said frame above said feet being bent over to form a stand-off portion engaging the surface of said printed circuit board to keep the heat sink from contacting said printed circuit board.

* * * * *